(12) United States Patent
Hwang et al.

(10) Patent No.: US 8,291,964 B2
(45) Date of Patent: Oct. 23, 2012

(54) HEAT SINK PROVIDING REDISTRIBUTED AIRFLOW THERETHROUGH

(75) Inventors: Ching-Bai Hwang, Taipei Hsien (TW); Jian-Zhong Lu, Shenzhen (CN)

(73) Assignees: Furui Precise Component (Kunshan) Co., Ltd., KunShan, Jiangsu Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 208 days.

(21) Appl. No.: 12/788,315

(22) Filed: May 27, 2010

(65) Prior Publication Data
US 2011/0253357 A1 Oct. 20, 2011

(30) Foreign Application Priority Data
Apr. 19, 2010 (CN) .......................... 2010 1 0150184

(51) Int. Cl.
*H05K 7/20* (2006.01)

(52) U.S. Cl. ........................... 165/78; 165/185; 361/704

(58) Field of Classification Search .................... 165/78, 165/80.3, 185; 361/704
See application file for complete search history.

(56) References Cited

U.S. PATENT DOCUMENTS

| 6,336,498 | B1 * | 1/2002 | Wei | 165/80.3 |
| 7,124,808 | B2 * | 10/2006 | Liu | 165/80.3 |
| 7,165,601 | B1 * | 1/2007 | Hashimoto | 165/78 |
| 7,343,962 | B2 * | 3/2008 | Xia et al. | 165/80.3 |
| 2004/0031587 | A1 * | 2/2004 | Fong | 165/80.3 |
| 2006/0092613 | A1 * | 5/2006 | Kao et al. | 361/704 |
| 2007/0137849 | A1 * | 6/2007 | Vackar | 165/185 |
| 2007/0215318 | A1 * | 9/2007 | Chiang | 165/78 |

* cited by examiner

*Primary Examiner* — Leonard R Leo
(74) *Attorney, Agent, or Firm* — Altis Law Group, Inc.

(57) ABSTRACT

An exemplary heat sink includes elongated fins stacked together. Each of the fins includes a first dissipating portion and a second dissipating portion arranged in turn along a longitudinal axis of the fin. The first dissipating portion and the second dissipating portion of each fin are offset from each other along a stacked axis of the fins. An opening is defined in each fin between the first dissipating portion and the second dissipating portion thereof.

13 Claims, 3 Drawing Sheets

HEAT SINK PROVIDING REDISTRIBUTED AIRFLOW THERETHROUGH

BACKGROUND

1. Technical Field

The present disclosure generally relates to heat sinks, and more particularly relates to a heat sink with high heat dissipation efficiency.

2. Description of Related Art

With the continuing development of electronics technology, electronic components of electronic devices, such as central processing units (CPUs), memory modules, and video graphics array (VGA) chips, feature increasingly high operating speeds. Accordingly, these electronic components generate much heat, which needs to be dissipated promptly to ensure the continued proper functioning of the electronic device.

Generally, a heat sink is mounted on the electronic component to absorb heat therefrom, and a cooling fan is provided to generate airflow and thereby draw heat from the heat sink. The heat sink includes a base, and a plurality of flat fins extending upwardly from the base. A plurality of airflow channels are formed between the fins.

However, to maximize the heat exchange area of the heat sink, the fins are usually large and dense. Thus the channels between the fins are often relatively narrow and long. When the airflow generated by the cooling fan passes through the channels, flow resistance caused by laminar air envelopes is formed on the surfaces of the fins and may significantly impede the airflow. Thus, the heat may not be effectively removed by the airflow, and the efficiency of the heat sink may be reduced.

For at least the foregoing reasons, there is a need in the art for a heat sink which overcomes the limitations described.

DETAILED DESCRIPTION

Figure 1:
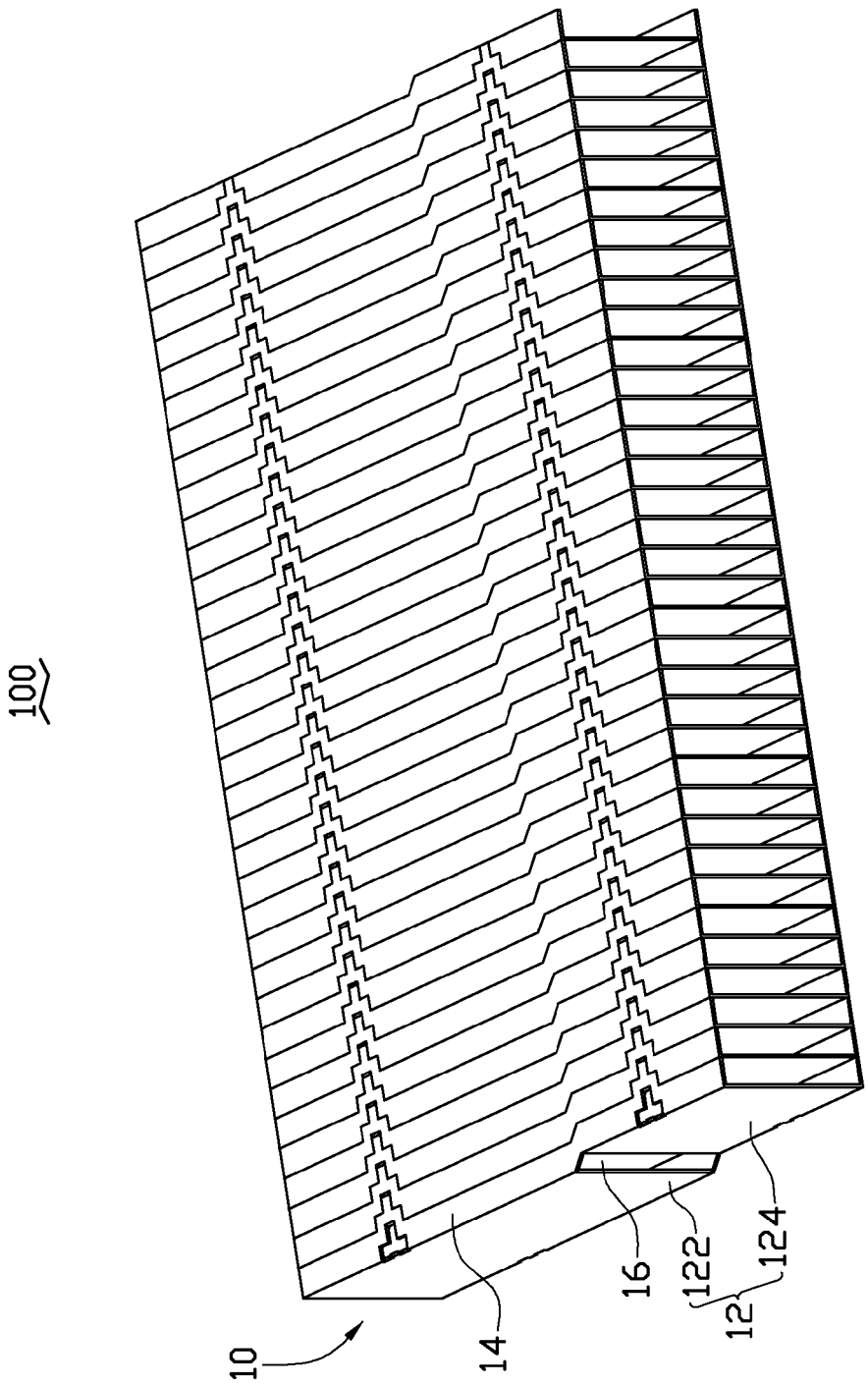
FIG. 1 is an isometric, assembled view of a heat sink in accordance with an exemplary embodiment.

Referring to FIG. 1, a heat sink 100 according to an exemplary embodiment is shown. The heat sink 100 includes a plurality of fins 10 stacked together. The fins 10 are parallel to and spaced from each other. Each of the fins 10 is made of metal or metal alloy with a high heat conductivity coefficient, such as copper, aluminum, copper-alloy or aluminum-alloy.

Figure 2:
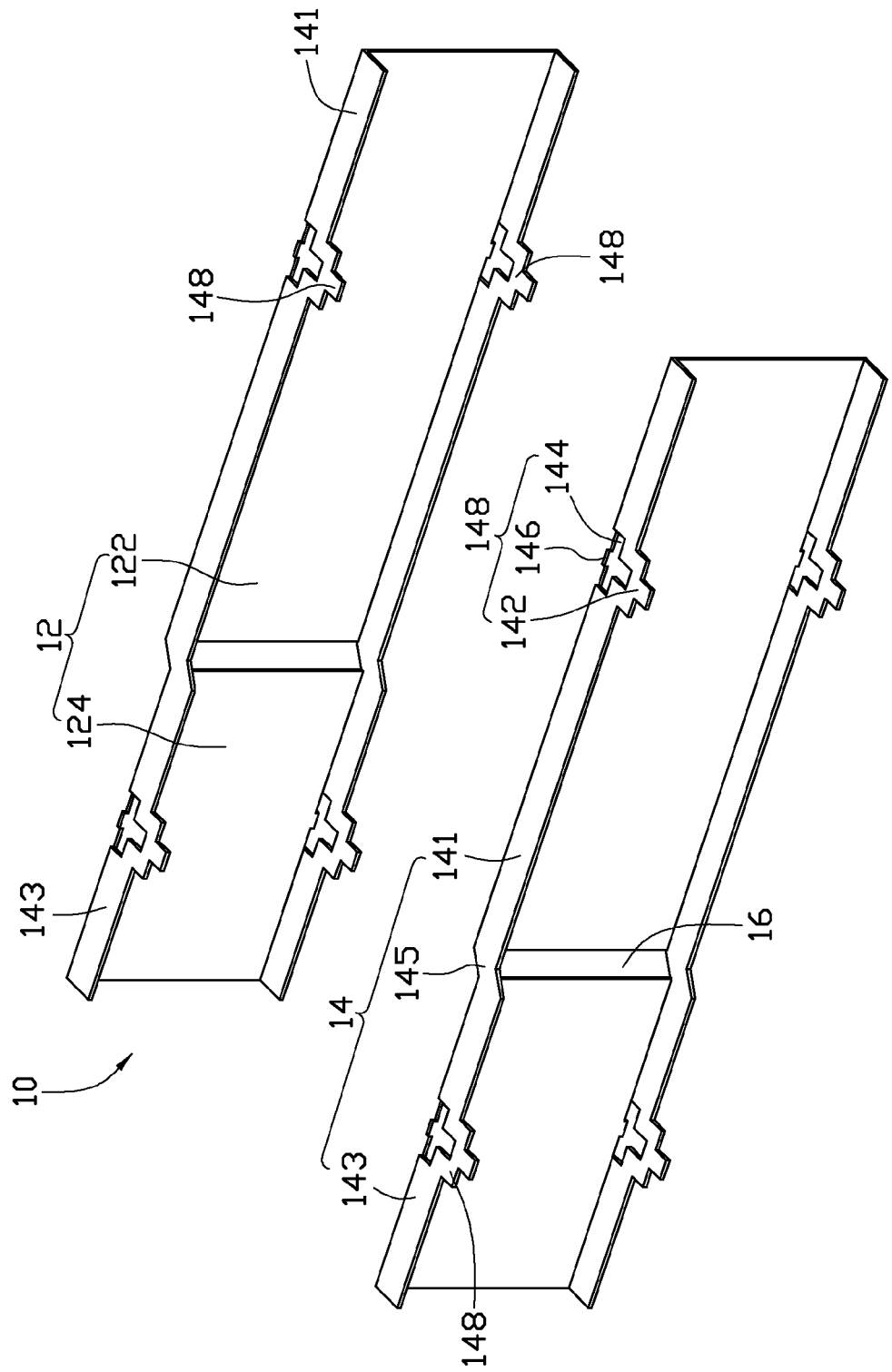
FIG. 2 shows two separated fins of the heat sink of FIG. 1, viewed from another aspect.

Referring also to FIG. 2, each of the fins 10 includes a main body 12 and a pair of flanges 14 bending from the main body 12. The main body 12 includes a first dissipating portion 122, and a second dissipating portion 124, each configured as a rectangular flat sheet. The first dissipating portion 122 and the second dissipating portion 124 are parallel to each other. Along a longitudinal axis of the fin 10, the first dissipating portion 122 and the second dissipating portion 124 are offset from each other by a narrow distance. Along a stack axis of the heat sink 100, perpendicular to the fin 10, the first dissipating portion 122 and the second dissipating portion 124 are spaced from each other a narrow distance. Thus an opening 16 is defined between the first dissipating portion 122 and the second dissipating portion 124 of each fin 10. The opening 16 is obliquely angled relative to both the first dissipating portion 122 and the second dissipating portion 124. An obtuse angle is defined between a plane on which the opening 16 is located and the first dissipating portion 122, and the same obtuse angle is defined between the plane on which the opening 16 is located and the second dissipating portion 124.

In this embodiment, each fin 10 is monolithically formed as a single piece by punching. The two flanges 14 extend perpendicularly from two opposite lateral sides (i.e., a top side and a bottom side) of the main body 12, respectively. Each flange 14 includes a first portion 141 joined to the first dissipating portion 122, a second portion 143 joined to the second dissipating portion 124, and a center portion 145 interconnecting the first portion 141 and the second portion 143. The center portions 145 of the two flanges 14 of each fin 10 are located at top and bottom ends of the opening 16. Each center portion 145 is parallelogram-shaped.

Two locking members 148 are formed on each of the first portion 141 and the second portion 143 of each flange 14 to lock the fins 10 together. It is to be understood that the number and the position of the locking members 148 can be changed according to the size or the shape of the fin 10, so as to firmly combine the fins 10 together. Each locking member 148 includes an ear 142, a locking hole 144, and a locking tab 146. The ear 142 is T-shaped, and extends horizontally outwards from an outer long edge of the flange 14. A width of the ear 142 measured in the direction of extension of the ear 142 from the flange 14 is approximately the same as a width of the flange 14. The locking hole 144 is defined in the flange 14, and has the same shape and size as the ear 142. Thus the locking hole 144 is T-shaped, and receives the corresponding ear 142 of a neighboring fin 10. The locking tab 146 is formed at the junction of the main body 12 and the flange 14, and corresponds to the locking hole 144 of the neighboring fin 10.

Referring to FIG. 1 again, in assembly, the fins 10 are stacked parallel to each other. Considering the heat sink 100 from left ("the front") to right ("the rear"), the flanges 14 of each forward fin 10 abut the main body 12 of a neighboring rearward fin 10. The ears 142 of each forward fin 10 are received in the locking holes 144 of the neighboring rearward fin 10 and engage with the locking tabs 146 of the neighboring rearward fin 10. Thus the fins 10 are locked together.

Figure 3:
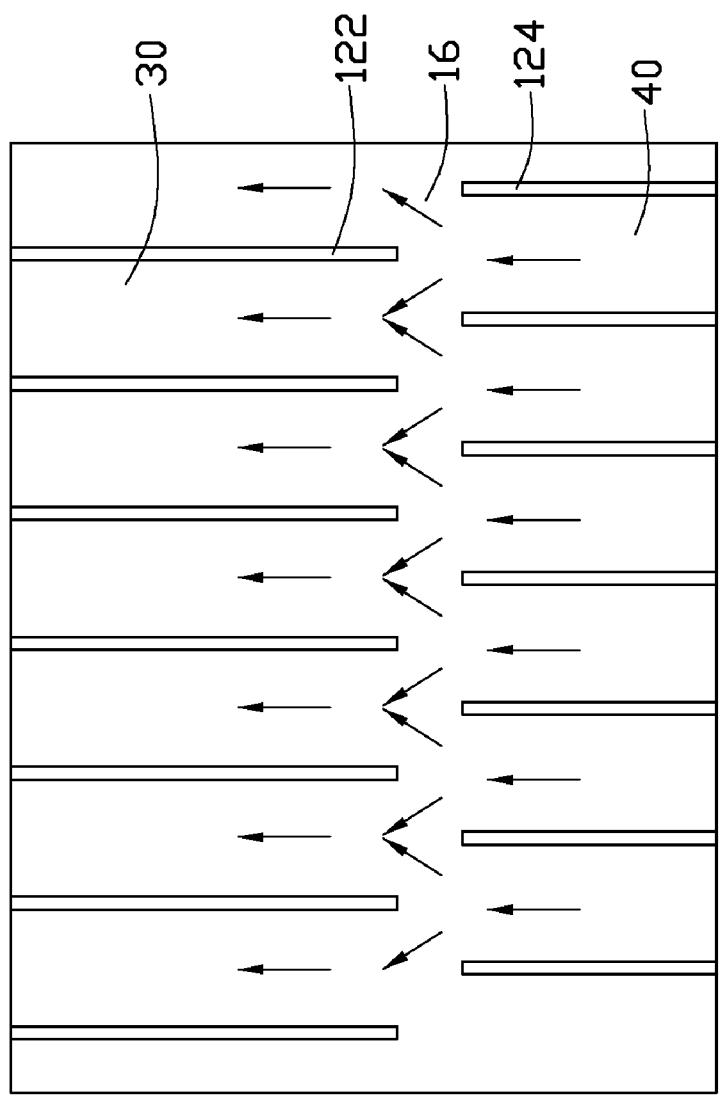
FIG. 3 is a schematic, plan view showing airflow through part of the heat sink of FIG. 1.

As shown in FIG. 3, after assembly, a first channel 30 is formed between the first dissipating portions 122 of neighboring fins 10, and a second channel 40 is formed between the second dissipating portions 124 of neighboring fins 10. A width of the first channel 30 is the same as that of the second channel 40. Each second dissipating portion 124 is aligned with a center axis (not shown) of the corresponding first channel 30, and each first dissipating portion 122 is aligned with a center axis (not shown) of the corresponding second channel 40. The opening 16 between the first dissipating portion 122 and the second dissipating portion 124 of each fin 10 communicates each first channel 30 with two adjacent second channels 40, and accordingly, communicates each second channel 40 with two adjacent first channels 30.

During operation, the heat sink 100 is mounted on an electronic component, such as a CPU, to absorb heat therefrom. A cooling fan (not shown) is at a lateral side of the heat sink 100 and faces the first channels 30 or the second channels 40 of the heat sink 100. The cooling fan generates airflow across the heat sink 100 to draw heat of the heat sink 100 away from the heat sink 100. For example, as illustrated in FIG. 3, the airflow enters the heat sink 100 via the second channels 40 and exits the heat sink 100 via the first channels 30. When passing from the second channels 40 to the first channels 30, the airflow in each second channel 40 branches and enters various first channels 30, at least including the two adjacent first channels 30. Thus, the airflow is redistributed when flowing from the second channels 40 into the first channels 30, that is, when flowing from the second dissipating portions 124 to the first dissipating portions 122 of the fins 10.

Alternatively, when the cooling fan is positioned to generate airflow into the heat sink 100 via the first channels 30, the airflow exits the heat sink 100 via the second channels 40. In particular, when passing from the first channels 30 to the second channels 40, the airflow in each first channel 30 branches and enters various second channels 40, at least including the two adjacent second channels 40.

Therefore, whether the airflow is from the first channels 30 to the second channels 40, or from the second channels 40 to the first channels 30, the airflow is redistributed at the openings 16 of the fins 10. As a result, laminar air envelopes that might otherwise be formed on the surfaces of the fins 10 are attenuated or even eliminated altogether. Accordingly, resistance to the airflow in the heat sink 100 is low even when the fins 10 of the heat sink 100 are elongated. The heat of the heat sink 100 can be easily removed, enhancing the efficiency of the heat sink 100.

It is to be understood, however, that even though numerous characteristics and advantages of certain embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A heat sink comprising a plurality of elongated stacked fins, each of the fins comprising a first dissipating portion and a second dissipating portion arranged in turn along a longitudinal axis of the fin, the first dissipating portion and the second dissipating portion of each fin offset from each other along a stack axis of the fins, wherein each fin further comprises two flanges respectively bending from a lateral side of the fin, each flange comprises a first portion adjoining the first dissipating portion, a second portion adjoining the second dissipating portion, and a center portion between the first portion and the second portion, an opening is defined in each fin between the first dissipating portion and the second dissipating portion thereof, and the opening is defined by edges of the center portions, the first dissipating portions and the second dissipating portions cooperatively.

2. The heat sink of claim 1, wherein the first dissipating portion and the second dissipating portion of each fin are offset from each other along the longitudinal axis of the fins, and the opening is obliquely angled relative to each of the first dissipating portion and the second dissipating portion.

3. The heat sink of claim 2, wherein an obtuse angle is defined between the opening and the first dissipating portion, and an obtuse angle is defined between the opening and the second dissipating portion.

4. The heat sink of claim 3, wherein the first dissipating portion and the second dissipating portion of each fin are parallel to each other, and the two obtuse angles are the same.

5. The heat sink of claim 3, wherein a first channel is defined between the first dissipating portions of each two neighboring fins, a second channel is defined between the second dissipating portions of each two neighboring fins, the first channel communicates with two corresponding adjacent second channels, with the communication with one of such corresponding adjacent second channels being via a corresponding opening, and the second channel communicates with two corresponding adjacent first channels, with the communication with one of such corresponding adjacent first channels being via a corresponding opening.

6. The heat sink of claim 5, wherein each first dissipating portion is aligned with a center axis of a corresponding second channel, and each second dissipating portion is aligned with a center axis of a corresponding first channel.

7. The heat sink of claim 1, wherein the center portion is located at an end of the opening, and is parallelogram-shaped.

8. The heat sink of claim 1, wherein a locking member is formed on the flange of each fin, and the locking member comprises an ear extending outwards from an outer edge of the flange, a locking hole defined in the flange and engagingly receiving the ear of a neighboring fin, and a locking tab corresponding to the locking hole formed at a junction of the main body and the flange, the locking members of the fins locking the fins together.

9. The heat sink of claim 8, wherein the locking tab of each fin is engagingly received in the locking hole of the neighboring fin.

10. A heat sink comprising a plurality of parallel fins with airflow channels formed between the fins, each fin comprising a first dissipating portion, a second dissipating portion, and an opening defined between the first dissipating portion and the second dissipating portion, the first dissipating portion of each fin aligned with the airflow channel between two corresponding second dissipating portions neighboring the first dissipating portion, the second dissipating portion of each fin aligned with the airflow channel between two corresponding first dissipating portions neighboring the second dissipating portion each fin further comprising two flanges respectively bending from a lateral side of the fin, each flange comprising a first portion adjoining the first dissipating portion, a second portion adjoining the second dissipating portion, and a center portion between the first portion and the second portion, the opening being defined by edges of the center portions, the first dissipating portions and the second dissipating portions cooperatively.

11. The heat sink of claim 10, wherein the first dissipating portion and the second dissipating portion are offset from each other along the airflow channels, an obtuse angle is defined between the opening and the first dissipating portion, and an obtuse angle is defined between the opening and the second dissipating portion.

12. The heat sink of claim 11, wherein the airflow channels comprise a plurality of first channels between the first dissipating portions and a plurality of second channels between the second dissipating portions, each first channel communicating with two corresponding adjacent second channels, with the communication with one of such corresponding adjacent second channels being via a corresponding opening, and each second channel communicating with two corresponding adjacent first channels, with the communication with one of such corresponding adjacent first channels being via a corresponding opening.

13. The heat sink of claim 10, wherein the center portion is located at an end of the opening and is parallelogram-shaped.

* * * * *